United States Patent

Matsuoka et al.

[11] Patent Number: 5,834,143
[45] Date of Patent: Nov. 10, 1998

[54] FRAME-SUPPORTED DUSTPROOF PELLICLE FOR PHOTOLITHOGRAPHIC PHOTOMASK

[75] Inventors: Takashi Matsuoka, Annaka; Yoshihiro Kubota, Takasaki; Meguru Kashida, Annaka, all of Japan

[73] Assignee: Shin-Etsu Chemical Co., Ltd., Tokyo, Japan

[21] Appl. No.: 754,777

[22] Filed: Nov. 21, 1996

[30]     Foreign Application Priority Data

Dec. 15, 1995   [JP]   Japan .................................. 7-347091

[51] Int. Cl.[6] ........................................................ G03F 9/00
[52] U.S. Cl. .................................................. 430/5; 428/14
[58] Field of Search .................... 430/5; 428/14

[56]            References Cited

U.S. PATENT DOCUMENTS

| 4,861,403 | 8/1989 | Yoshimi et al. . | |
| 5,419,972 | 5/1995 | Kawaguchi et al. | 428/626 |
| 5,470,621 | 11/1995 | Kashida et al. | 428/14 |

FOREIGN PATENT DOCUMENTS

| 0 304 211 A2 | 2/1989 | European Pat. Off. . |
| 0 622 680 A2 | 11/1994 | European Pat. Off. . |
| 58-219023 | 12/1983 | Japan . |
| 63-777 | 1/1988 | Japan . |
| 63-27707 | 2/1988 | Japan . |
| 64-48062 | 2/1989 | Japan . |
| 6-301199 | 10/1994 | Japan . |
| 08292555 | 11/1996 | Japan . |

*Primary Examiner*—S. Rosasco
*Attorney, Agent, or Firm*—Oliff & Berridge, PLC

[57]                ABSTRACT

Proposed is a frame-supported pellicle used for dustproof protection of a photomask in the photolithographic patterning work for the manufacture of electronic fine devices such as LSIs, VLSIs and the like by mounting thereon. The inventive frame-supported pellicle is characterized in that the pellicle frame, to which a pellicle membrane is adhesively bonded on one of the end surfaces, is partly subjected to smoothing treatment. The inventive frame-supported pellicle can solve the heretofore unavoidable problems of dust particle deposition on the photomask even under dustproof protection with a pellicle as well as the high cost of the preparation of the pellicle and the difficulty of finding of any dust particles deposited on the surface of the frame.

4 Claims, 1 Drawing Sheet

FRAME-SUPPORTED DUSTPROOF PELLICLE FOR PHOTOLITHOGRAPHIC PHOTOMASK

TECHNICAL FIELD

The present invention relates to a frame-supported dustproof pellicle for a photolithographic photomask used in the patterning works in the manufacture of, for example, fine electronic materials such as semiconductor devices and liquid display panels. More particularly, the invention relates to a frame-supported dustproof pellicle for a photolithographic photomask, which is almost completely freed from the troubles due to occurrence of dust particles from the pellicle frame per se.

BACKGROUND OF THE INVENTION

As is known, the photolithographic method is well established in the patterning works for the manufactures of semiconductor devices, such as LSIs, VLSIs and the like, liquid crystal display panels and other electronic materials, in which the photoresist layer formed on the surface of a substrate such as a silicon semiconductor wafer is pattern-wise irradiated with light at a wavelength of about 500 nm or less, such as ultraviolet light, through a transparency called a photomask followed by development to form a patterned resist layer. In view of the extremely high fineness and precision required in this patterning work, it is very important that the photomask is absolutely dust-free since, when dust particles are deposited on the photomask, the light passing through the photomask is necessarily scattered by the dust particles to give a great influence on the quality of the reproduced pattern such as fidelity to the photomask pattern and contrast of the images.

It is therefore a usual practice that the photolithographic patterning work is conducted in a clean room under an atmosphere freed from any floating dust particles as completely as possible although perfect cleanness can hardly be obtained even in a clean room of the highest cleanness. Accordingly, deposition of dust particles on the photomask must be prevented by mounting a frame-supported dustproof pellicle on the photomask. The frame-supported dustproof pellicle above mentioned is a device consisting of a frame, rectangular in most cases as shown in FIG. 1, made from a rigid material such as an aluminum alloy and a thin, highly transparent film of a polymer, which is called a pellicle membrane, stretched over and adhesively bonded to one end surface of the frame in a drumhead-like slack-free fashion.

When a frame-supported pellicle is mounted on the photomask, the dust particles floating in the atmospheric air and falling therefrom are never deposited directly on the photomask but deposited on the pellicle membrane. Since the light beams used for the pattern-wise irradiation are focused at the patterned images on the photomask, the dust particles deposited on the pellicle membrane, which is held apart above the photomask, have little adverse influences on the quality of pattern reproduction in the photolithography.

In the prior art, the pellicle frame is shaped from a rigid material such as aluminum, aluminum alloys, stainless steels, polyethylene resins and the like, and a transparent pellicle membrane of a polymer such as nitrocellulose, cellulose acetate, modified polyvinyl alcohol, fluorocarbon resin and the like is, as is taught in Japanese Patent Kokai 58-219023, applied to one end surface of the pellicle frame wet with a good solvent of the polymer followed by air-drying to effect permanent adhesive bonding of the membrane to the pellicle frame or is adhesively bonded to one end surface of the frame by using an acrylic or epoxy resin-based adhesive as is taught in U.S. Pat. No. 4,861,403 and Japanese Patent Publication 63-27707. Preferably, the other end surface of the pellicle frame is coated with a pressure-sensitive sticky adhesive such as those based on a polybutene resin, polyvinyl acetate resin, acrylic resin and the like in order to facilitate mounting and immobilization thereof on the photomask. The end surface of the frame coated with the pressure-sensitive adhesive is temporarily protected from inadvertent sticking by attaching a removable surface-release sheet or film.

In view of the dustproofing object of the use of a frame-supported pellicle, it is essential that the pellicle membrane is absolutely free from deposit of dust particles thereon and that any part of the pellicle frame is not responsible for the occurrence of dust particles therefrom. Therefore, extreme care is required in the preparation of frame-supported pellicles, but nevertheless, perfectly dust-free conditions can hardly be obtained and one of the problems to be solved is occurrence of dust particles from the pellicle frame per se.

Among the materials of the pellicle frames including aluminum, aluminum alloys, stainless steels, polyethylene resins and the like above mentioned, aluminum or aluminum alloys are preferred in respects of the high mechanical strengths relative to the lightness in weight and high hardness to ensure durability of the frame-supported pellicle. It is usual that the surface of the pellicle frame of aluminum or an aluminum alloy is subjected to an anodization treatment in order to further improve the stability of the frame against the influence of the atmosphere and the thus anodized surface layer of the pellicle frame is stained in black color by black pigments in order to minimize the adverse influences of the stray light on the quality of the reproduced image pattern obtained in the photolithographic patterning works.

When the surface of the pellicle frame of aluminum or an aluminum alloy is anodized and the anodized surface layer is stained in black color, the black anodized surface layer of aluminum or an aluminum alloy is very smooth at least as viewed by naked eyes but, microscopically far from a smooth surface, rather is rugged with numberless protrusions and fissure-like recesses as is seen on the scanning electron microscopic photographs, and is relatively brittle.

As is mentioned above, it is always the case that dust particles in a number more than negligible are found as deposited on the photomask even when it is under dustproof protection by mounting a frame-supported pellicle thereon notwithstanding the utmost care undertaken in the manufacture of frame-supported pellicle to ensure dust-free conditions. This is due to the scattering of dust particles including black pigments and the like in the recesses of the anodized surface layer and the flaking of the brittle anodized surface layer, by any force or vibration occurring in the preparation of the frame-supported dustproof pellicle. It was proposed that the inside surface of the pellicle frame is provided with a layer of a sticking agent or coated with a coating composition to capture the floating dust particles or prevent the dust particles from occurring (see Japanese Patent Publication 63-777 and Japanese Patent Kokai 64-48062).

Such ways that the inside surface of the pellicle frame is provided with a layer of a sticking agent or coated with a coating composition have an effect of capturing the floating dust particles with the inside surface of the pellicle frame or preventing the dust particles from occurring from the inside surface of the pellicle frame, but it is not possible to prevent the dust particles from occurring from the part other than the inside surface of the pellicle frame. Namely, it is a usual way of handling of frame-supported pellicles that they are encased one by one in the holder case made, for example, of a plastic resin, so that rubbing takes place unavoidably between the inner surface of the holder case and the outer surface of the pellicle frame during handling and, in particular, transportation of the encased frame-supported pellicles from the manufacturing plant to the users resulting in occurrence of dust particles because the rugged surface of the anodized layer is relatively brittle.

To solve the problem of such know techniques, the present inventors have already proposed that the entire surface of the pellicle frame is subjected to smoothing treatment to prevent the dust particles from occurring (see Japanese Patent Kokai 6-301199). When such a pellicle frame is used, the occurrence of the dust particles from not only the inside surface of the frame but also the outside thereof is prevented so that the numbers of the dust particles deposited on the inside and outside surfaces of the pellicle membrane and the surface of the pellicle flame are not increased even after the long transportation.

However, the present inventors have found that the prior pellicle in which the entire surface of the pellicle frame is subjected to smoothing treatment, has two disadvantages, one being the difficulty of finding dust particles which are, by any chance, deposited on the smoothed inside surface of the pellicle frame, the other being the difficulty and increased cost in the preparation of the frame-supported dustproof pellicle.

SUMMARY OF THE INVENTION

The present invention accordingly has an object to provide a frame-supported pellicle for the dustproof protection of a photomask in the photolithographic patterning works, which is capable of solving the above problems and disadvantages of the know techniques and the prior invention, that is, from which any dust particles do not occur, and on which any dust particles can be easily found, and which can be simply produced at low cost.

Thus, the frame-supported pellicle of the present invention for dustproof protection of a photomask comprises:

(a) a pellicle frame having outside and inside surfaces and two end surfaces;

(b) a pellicle membrane which is a transparent film stretched over and adhesively bonded to one of the end surfaces of the pellicle frame; the surfaces of the pellicle frame being partly subjected to smoothing treatment to prevent any dust particles from occurring therefrom.

In one preferred embodiment, the bare surfaces of the frame, that is, the inside and outside surfaces, in particular only the outside surface is subjected to the smoothing treatment If the inside surface of the frame is not subjected to the smoothing treatment, it is preferably provided with a layer of a sticking agent. In another preferred embodiment the smoothing treatment is carried out by coating the part of the surface of the pellicle frame with a non-adhesive, transparent organic polymer, preferably a solvent-soluble, amorphous fluorine-containing polymer to form a surface-sealing layer thereon.

The present invention is particularly advantageous when the pellicle frame is made from an aluminum or aluminum alloy which has a surface layer formed by an anodization treatment.

DETAILED DESCRIPTION OF THE INVENTION

Figure 1:
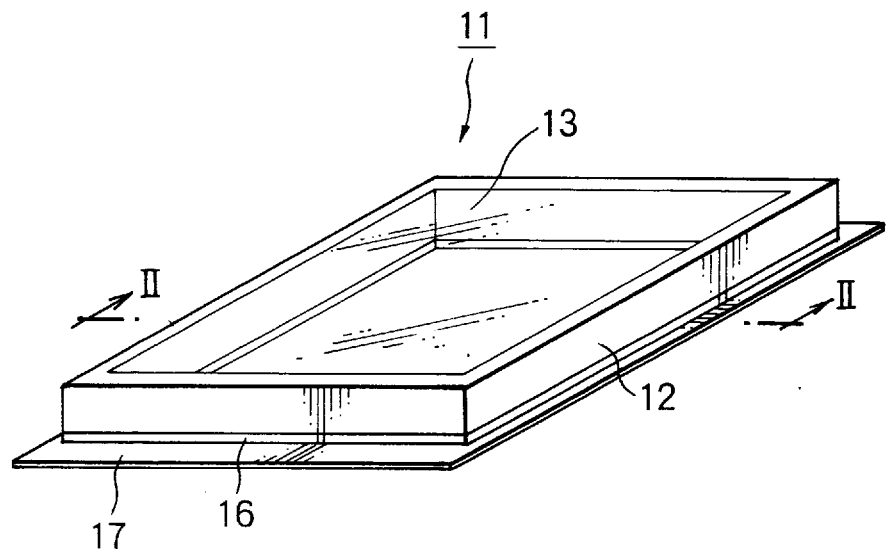
FIG. 1 is a perspective view of a typical frame-supported pellicle according to the present invention.
Figure 2:
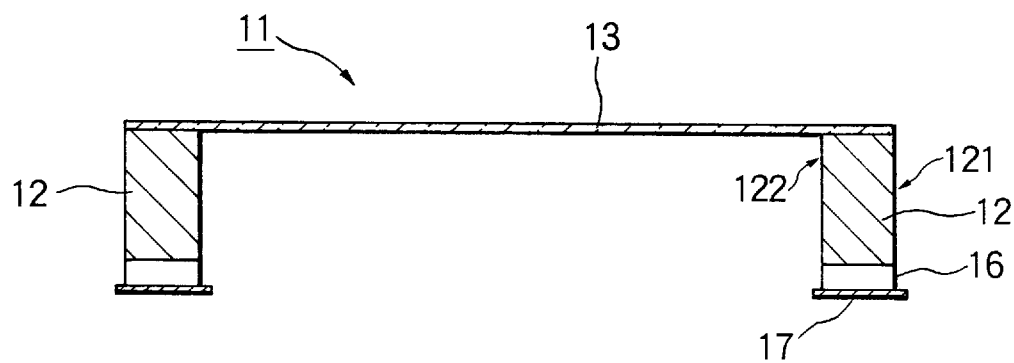
FIG. 2 is a cross section taken in the line I—II of FIG. 1.

The present invention will be described in further detail by way of example with reference to the accompanying drawings. Referring to FIGS.1 and 2, there is shown a preferred embodiment of a frame-supported pellicle 11 of the present invention, which basically includes a pellicle frame 12, which has an outside surface 121, an inside surface 122 and two end surfaces, and a pellicle membrane 13 which is stretched over and adhesively bonded to one end surface of the pellicle frame 12. The other end surface of the pellicle frame 12 is provided with a layer of a pressure-sensitive adhesive 16, which is temporarily protected by a removable surface-release sheet or film 17.

In the present invention, conventional pellicle frames can be used as the pellicle frame 12. Such pellicle frames include those made from a rigid material such as, for example, aluminum, aluminum alloys, stainless steels, polyethylene resins and the like. In particular, aluminum or aluminum alloys are preferred in respects of the high mechanical strengths relative to the lightness in weight and high hardness to ensure durability of the frame-supported pellicle. The aluminum alloy herein described is an alloy mainly consisting of aluminum or containing at least 50% by weight of aluminum. The surfaces of the pellicle frame of aluminum or an aluminum alloy are generally anodized to form an anodized surface layer and the anodized surface layer is stained in black color by conventional black pigments. The conditions for the anodization treatment and black staining can be conventional.

In the frame supported pellicle 11 of the present invention, some part of the surfaces of the pellicle frame 12, preferably, the outside and inside surfaces 121, 122, in particular, only the outside surface 121, is subjected to smoothing treatment to prevent dust particles from occurring therefrom. According to the frame-supported pellicle, the occurrence of dust particles from the pellicle frame can be reduced or prevented, and the complexity and cost of the preparation of the frame-supported pellicle can be reduced. If the outside surface 121 is subjected to the smoothing treatment, it can be prevented from producing dust particles even when it is rubbed against the inner surface of the holder case, and, if the inside surface 122 is not subjected to the smoothing treatment, any dust particles which are, by any chance, deposited thereon can be easily found.

Therefore, according to the present pellicle, the occurrence of dust particles from the frame per se is prevented in such a manner, so that, when the frame-supported pellicle is mounted on the photomask, the deposition of dust particles occurring from the frame per se on the photomask can be sufficiently prevented and dustproof conditions can be more certainly obtained in the patterning works for the manufactures of, for example, semiconductor devices or liquid crystal display panels.

In the present invention, the smoothing treatment includes, for example, metal plating, treatment with a glass flit of low melting point, chemical vapor deposition (CVD) and physical vapor deposition (PVD) such as spattering, as well as, coating treatment with an organic polymer or a combination of organic polymers to form a surface-sealing layer on the surface of the frame. The coating treatment is preferably carried out in the present invention because of its simplicity and its superior smoothing effect. A method of the smoothing treatment of the part of the surfaces of the frame is conventional including, for example, one where the part to which the smoothing treatment should not be subjected (for example, both the end surfaces) is masked with pressure sensitive adhesive tapes for masking in a conventional manner, then the non-masked part is subjected to the smoothing treatment and then the masking tapes are released.

Various kind of organic polymers can be used for the purpose of the coating treatment, that is, coating the surfaces of the frame therewith, including non-adhesive, transparent organic polymers including thermoplastic and thermosetting resins such as, for example, acrylic resins, epoxy resins, silicone resins, fluorocarbon resins and the like.

Preferably, the organic polymer for the coating treatment of the frame surface should satisfy several requirements including transparency not to hide the black-stained surface of the pellicle frame, easiness of coating works therewith such as high solubility in organic solvents, high mechanical strengths such as high hardness and resistance against scratches and mechanical shocks, absence of tackiness on the surface, lubricity on the surface, susceptibility to adhesive bonding of the pellicle membrane, stability against irradiation with light and so on. In this regard, solvent-soluble amorphous fluorine-containing polymers are suitably used, because they satisfy mostly the above mentioned requirements, that is, they are non-adhesive, transparent and do not hide the black-stained surface, have high solubility in organic solvents, produce a surface-sealing layer having high mechanical strengths and high light stability, can be easily handled, and in particular, they produce, without occurrence of any dust particles, a surface-sealing layer on the surfaces of the frame, the layer having higher strength against mechanical shock in comparison with the other treatment such as treatment with a glass flit of low melting point, and sufficient protecting the brittle surfaces of the pellicle frame.

Furthermore, the surface-sealing layer produced from the amorphous fluorine-containing polymers has high lubricity, so that rubbing or wear-out between the pellicle frame and a holder case when the pellicle is transported in the holder case is remarkably reduced, and the occurrence of dust particles due to the rubbing or wear-out, which is a main cause of the occurrence of dust particles, can be remarkably reduced.

Several types of amorphous fluorine-containing polymers are available on the market including copolymers of tetrafluoroethylene and a fluorine-containing monomeric compound having a cyclic perfluoroether group in a molecule. Examples of commercial products suitable to amorphous fluorine-containing polymers include those sold under the trade name of Teflon AF (a product by Du Pont Co.) which is a copolymer consisting of the monomeric units as expressed by the formula

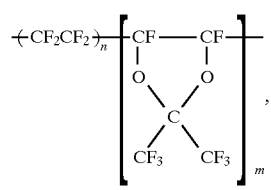

in which m and n are each a positive integer with the proviso that the ratio $m/(m+n)=0.66$,
and Sytop A (a product by Asahi Glass Co.) which is a copolymer consisting of the monomeric units as expressed by the formula

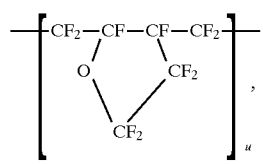

in which u is a positive integer. These fluorine-containing organic polymers have good solubility in certain fluorine-containing organic solvents mainly consisting of, for example, perfluoro(2-butyl tetrahydrofuran) such as a commercial product sold under a trade name of Florinert FC-75 (a product by 3M Co.) to give a uniform solution so that the pellicle frame can be easily coated with the solution by the method of spraying of the solution or dipping of the frame in the solution followed by drying. The adhesiveness of the surface-sealing layer of these polymers to the anodized surface of a pellicle frame of an aluminum or aluminum alloy is usually good but adhesion therebetween can be further improved by the addition of an adhesion-improving agent or by the modification of the polymer.

The method for coating the surfaces of the pellicle frame with these organic polymers can be conventional including the methods of spraying of a solution of the polymer, dipping of the frame in a solution of the polymer followed by drying, electrostatic coating, electrodeposition coating and the like depending on the types of the organic polymers. The thickness of the surface-sealing layer on the pellicle frame is generally in the range from 0.1 to 10 $\mu$m, preferably from 0.5 to 2 $\mu$m. When the thickness of the layer is too small, the desired effect of smoothing of the frame surface can be obtained only insufficiently while, when the thickness is too large, an economical disadvantage is caused due to the increase in the cost for the coating treatment without further increasing the smoothing effect of the frame surface. Thickness of the layer can be readily controlled by adequately adjusting the concentration of the polymer in the coating solution.

If the inner surface of the frame is not subjected to the smoothing treatment in respect for the easy finding of any dust particles thereon, it is possible to use the conventional method that the inner surface of the pellicle frame is coated with a sticking agent to form a layer thereof, for the purpose of the prevention of the occurrence of dust particles from the inner surface of the frame.

The pellicle frame, the part of which is subjected to the smoothing treatment in the above described manner, is then provided with a pellicle membrane by adhesive bonding to one of the end surfaces in a conventional fashion. The material and thickness of the pellicle membrane as well as the method for adhesively bonding the same to one of the end surfaces of the pellicle frame can be conventional without particular limitation although the pellicle membrane is made preferably from an amorphous fluorine-containing polymer such as those used in the coating work of the frame surface or those similar thereto because these polymers have good film formability and the films therefrom are highly transparent and resistant against ultraviolet irradiation. The method for adhesively bonding the pellicle membrane to one of the end surfaces of the pellicle frame is conventional including, for example, one where one end surface of the pellicle frame is coated with a good solvent of the pellicle membrane or an acrylic or epoxy resin-based adhesive and the membrane is bonding to the end surface via the solvent or adhesive.

The frame-supported pellicle adhesively bonded with the pellicle membrane to the end surface of the pellicle frame is then coated with a pressure-sensitive adhesive to the other end surface of the frame, and the pressure-sensitive adhesive is temporarily covered with a removable surface-release sheet or film. The removable surface-release sheet or film can be conventional.

In the present invention, all of the bare surfaces of the pellicle frame is preferably subjected to the smoothing treatment, but it can be confirmed that, if only the part of the bare surfaces, for example, only the outside surface of the frame is subjected to the smoothing treatment, the occurrence of any dust particles from the frame is pretty reduced.

The invention is illustrated in more detail by reference to the following example.

EXAMPLE 1 AND COMPARISON EXAMPLE 1

A coating solution of an organic polymer was prepared in Example 1 by dissolving Teflon AF (supra) in a solvent Florinert FC-75 (supra) in a concentration of 4.0% by weight. The outside surface of a rectangular frame of an aluminum alloy, of which the inner dimensions were 116 mm by 94 mm the outer dimensions were 120 mm by 98 mm, the height was 5.8 mm and the surface was anodized and stained in black, was sprayed with the coating solution followed by drying at 150° C. to form a surface-sealing layer only on the outside surface of the pellicle frame.

Subsequently, the inside surface of the pellicle frame was thinly coated with a silicone sticking agent in a conventional manner, and then a film of nitrocellulose having a thickness of 0.86 $\mu$m as a pellicle membrane was adhesively bonded to one of the end surfaces of the pellicle frame by using an epoxy resin-based adhesive in a conventional manner while the other end surface of the frame was coated with a silicon-based pressure-sensitive adhesive agent to form a pressure-sensitive layer of 0.5 mm in thickness, the sticky surface thereof being protected by attaching a surface-release sheet coated with a fluorocarbon resin. The thus prepared frame-supported pellicle was encased in a polyethylene-made holder case and subjected to a transportation test on truck over a distance of about 2500 kilometers via a highway. The frame-supported pellicle after the transportation test was taken out of the case and subjected to an inspection for dust deposition by counting the number of the dust particles of 0.3 $\mu$m or larger deposited on a 116 mm by 94 mm area of the pellicle membrane by using a laser beam detector to find absolutely no deposition of dust particles thereon. Needless to say, no dust particles were found on the pellicle membrane before the transportation test.

Separately, in Comparative Example 1, another frame-supported pellicle was prepared in the same manner as above excepting omission of the coating treatment of the pellicle frame with Teflon AF and this comparative pellicle was subjected concurrently to the transportation test to detect 36 dust particles on the 116 mm by 94 mm area of the pellicle membrane while no dust particles were found on the pellicle membrane before the transportation test

What is claimed is:

1. A frame-supported pellicle for dustproof protection of a photomask used in a photolithographic patterning work which comprises:

(a) a pellicle frame having outside and inside surfaces and two end surfaces; and (b) a pellicle membrane which is a transparent film stretched over and adhesively bonded to one of the end surfaces of the pellicle frame; in which only the outside surface of the pellicle frame is subjected to spray coating with a fluorine-containing organic polymer.

2. The frame-supported pellicle as claimed in claim 1 in which the pellicle frame is made from aluminum or an aluminum alloy which has a surface layer formed by an anodization treatment.

3. The frame-supported pellicle as claimed in claim 1 in which the inside surface of the frame is provided with a layer of a sticking agent.

4. The frame-supported pellicle as claimed in claim 1 in which a layer of the spray coating has a thickness in the range from 0.1 to 10 $\mu$m.

* * * * *